United States Patent [19]

Patton, III

[11] Patent Number: 4,745,524
[45] Date of Patent: May 17, 1988

[54] MOUNTING OF PRINTED CIRCUIT BOARDS IN COMPUTERS

[75] Inventor: Charles R. Patton, III, Long Beach, Calif.

[73] Assignee: Western Digital Corporation, Irvine, Calif.

[21] Appl. No.: 42,267

[22] Filed: Apr. 24, 1987

[51] Int. Cl.[4] ............................................. H05K 07/12
[52] U.S. Cl. ...................................... 361/399; 211/41; 361/395; 361/413; 361/415; 364/708
[58] Field of Search .................... 364/708; 211/41; 361/344, 395, 399, 413, 415

[56] References Cited

U.S. PATENT DOCUMENTS

| | | | |
|---|---|---|---|
| 2,940,017 | 6/1960 | Murphy et al. | 361/394 |
| 3,643,204 | 2/1972 | Drenten | 361/413 X |
| 3,805,117 | 4/1974 | Hausman | 361/395 |
| 3,919,738 | 11/1975 | Schmall | 361/399 |
| 4,159,505 | 6/1979 | Carp et al. | 361/399 |
| 4,161,017 | 7/1979 | Pierce et al. | 361/399 X |
| 4,198,024 | 4/1980 | Cavanna | 361/399 X |
| 4,388,671 | 6/1983 | Hall et al. | 361/395 X |
| 4,401,351 | 8/1983 | Record | 361/395 X |
| 4,434,537 | 3/1984 | Bean et al. | 361/395 X |
| 4,462,499 | 7/1984 | Calabro | 361/399 X |
| 4,468,718 | 8/1984 | Main | 361/394 X |
| 4,486,816 | 12/1984 | Hope | 361/395 X |
| 4,503,484 | 3/1985 | Moxon | 361/395 |
| 4,582,375 | 4/1986 | Keller | 361/415 X |
| 4,680,674 | 7/1987 | Moore | 364/708 X |

FOREIGN PATENT DOCUMENTS

| | | | |
|---|---|---|---|
| 660392 | 9/1965 | Belgium | 211/41 C |
| DT3141864 | 5/1983 | Fed. Rep. of Germany | 361/399 |
| 37653 | 4/1965 | German Democratic Rep. | 361/415 |

*Primary Examiner*—R. R. Kucia
*Attorney, Agent, or Firm*—Christie, Parker & Hale

[57] ABSTRACT

A mounting system for mounting an expansion card inside a computer chassis includes a mounting bracket having a combination board mounting clip and chassis mounting tab formed as an integral unit in which the bracket releasebly fastens to a corner of the expansion card. The expansion card has a bottom edge connector for plugging into an expansion card socket at the base of the computer chassis inside the expansion slot. The computer chassis also has a removeable cover plate on a panel of the chassis for shielding the expansion slot. The board mounting clip releasably fastens to the expansion card by engaging the opposite faces of the board in a continuous frictional means of attachment without the use of external fastening means. The chassis mounting tab is arranged so that when the expansion card is plugged into the expansion card socket, a portion of the chassis mounting tab automatically registers with the fastener for the cover plate so that the fastener is usable to fasten the tab to a portion of the chassis adjacent the cover plate, with the cover plate providing a separate means of shielding the expansion slot, independently of the bracket on the expansion card.

20 Claims, 6 Drawing Sheets

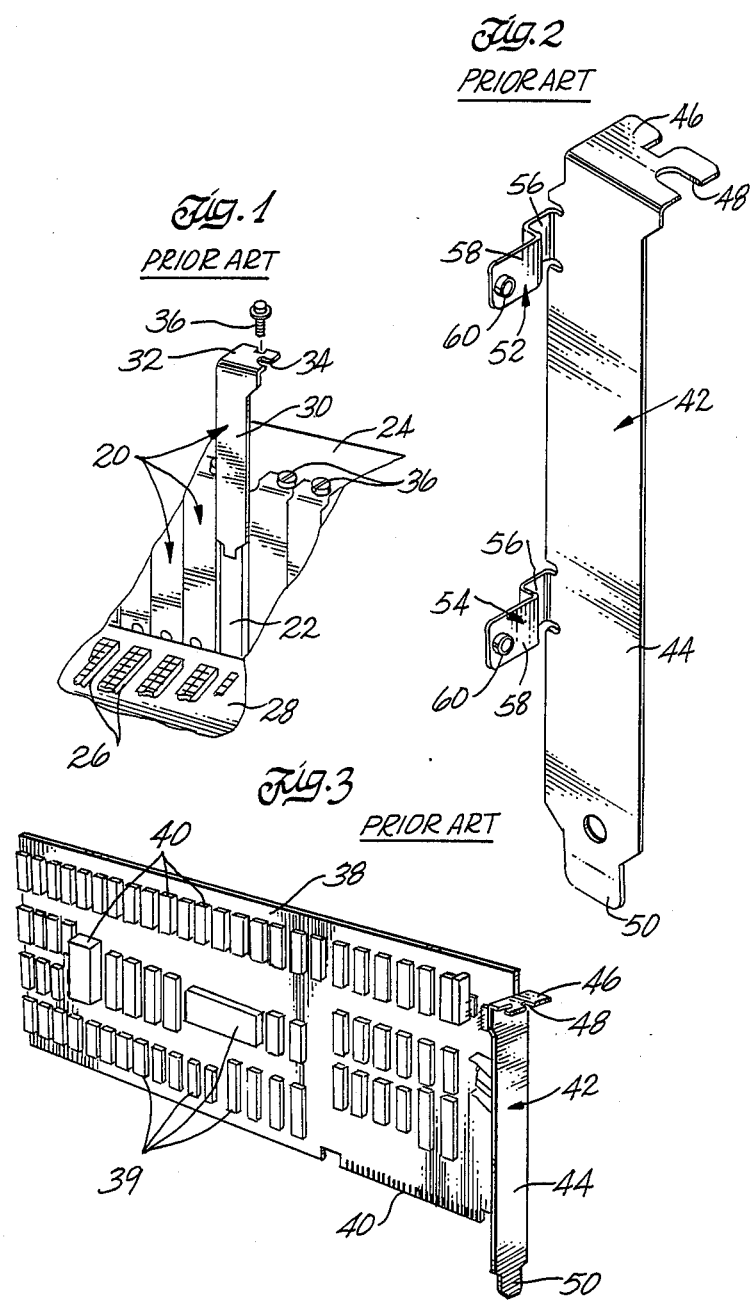

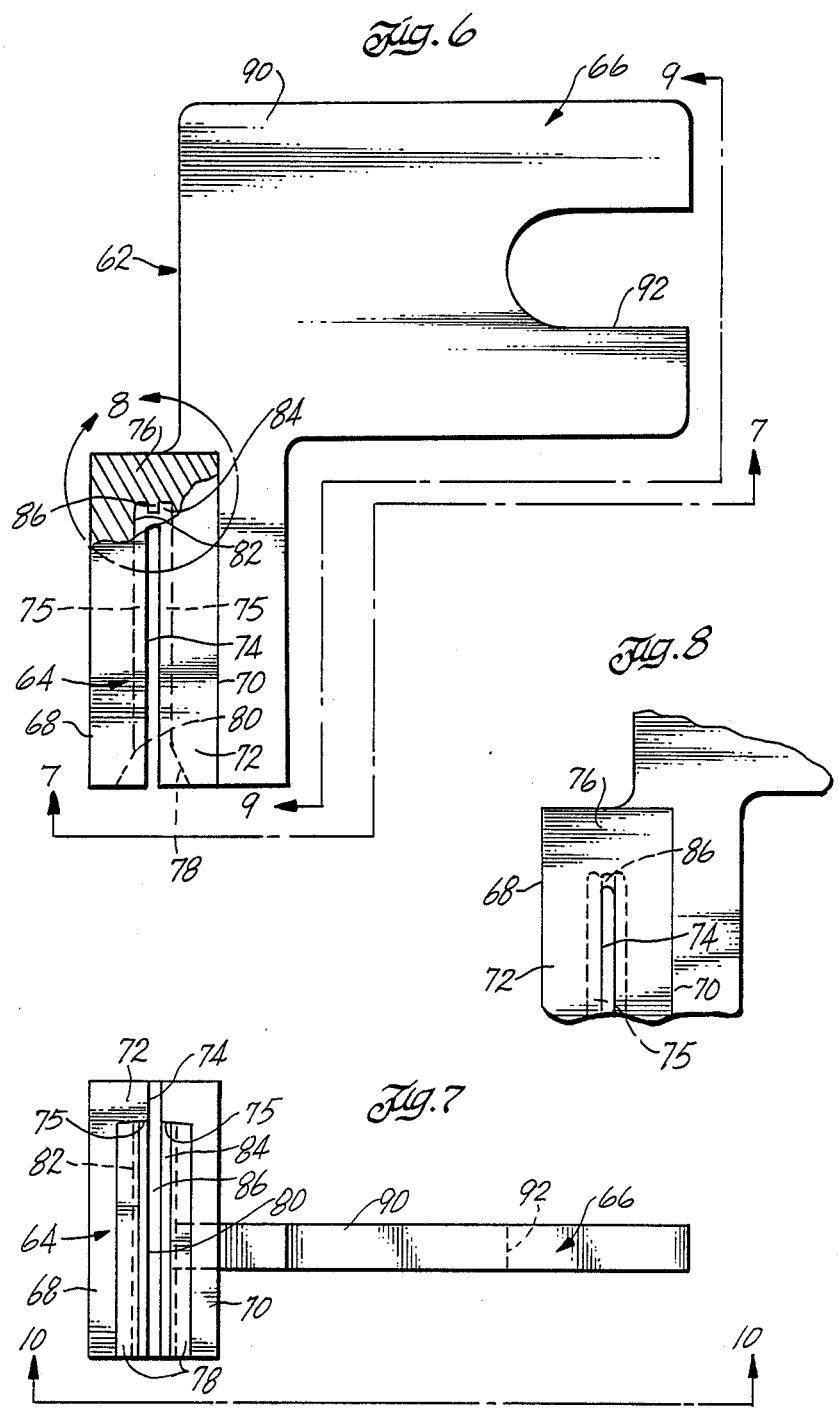

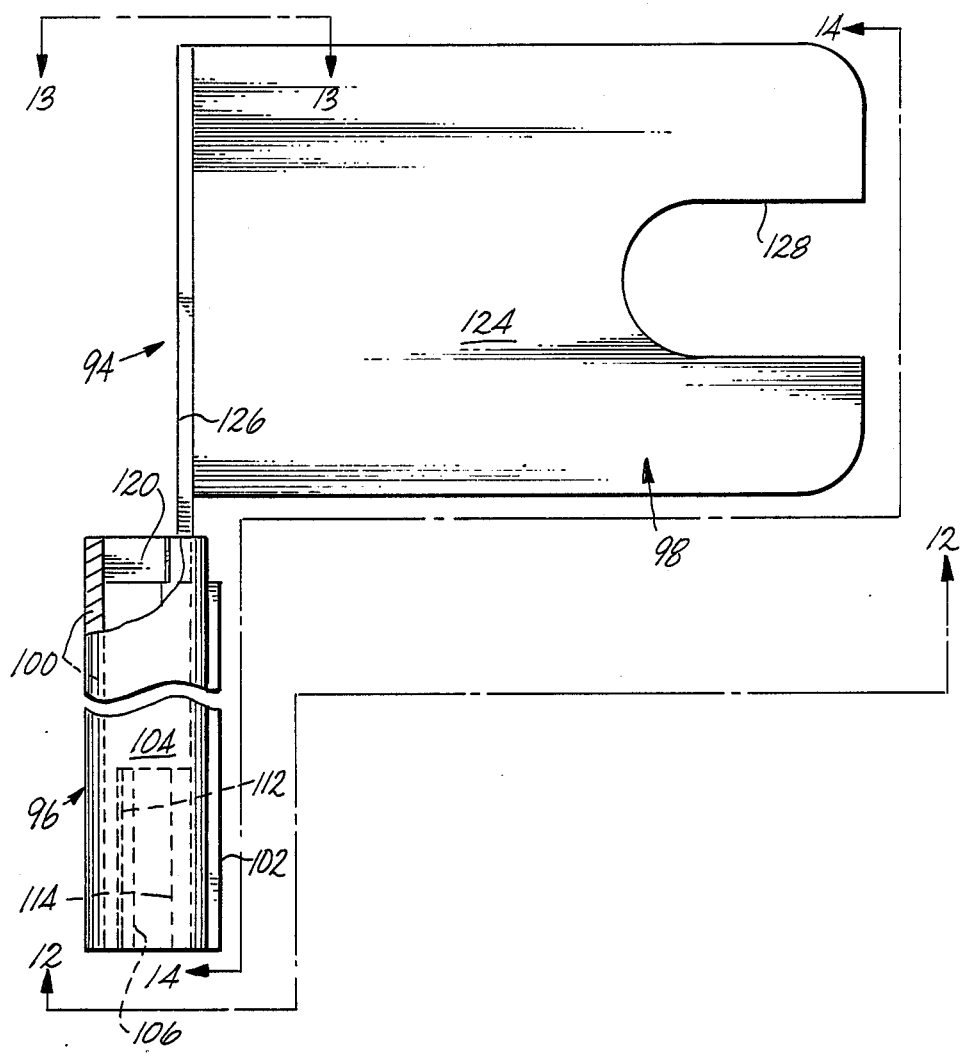
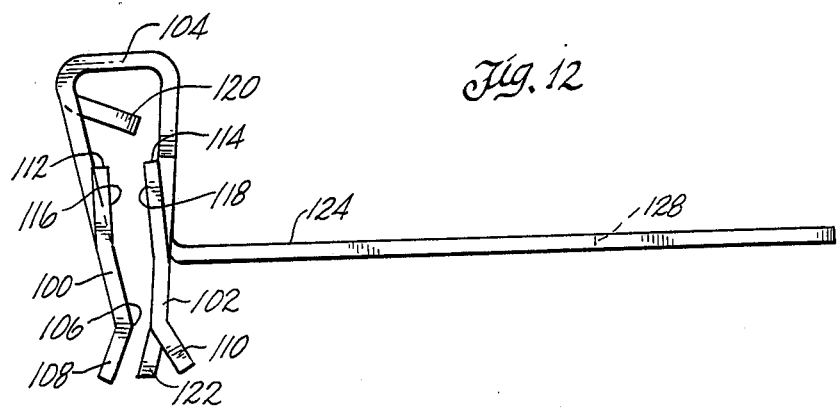

MOUNTING OF PRINTED CIRCUIT BOARDS IN COMPUTERS

FIELD OF THE INVENTION

This invention relates to the mounting of printed circuit boards in computers, and more particularly, to a mounting system for fastening an expansion card in place inside an expansion slot of a computer.

BACKGROUND OF THE INVENTION

Personal computers such as the IBM family of personal computers and the so-called IBM clones or compatibles are produced with an "open architecture" design for allowing additional functions to be later added to the computer. As a result, a number of manufacturers produce various printed circuit boards or "expansion cards" which are mounted in the computer for later expanding its available functions. For instance, expansion cards can be installed in the computer to provide a hard disk drive controller, a color/graphics monitor, networking, memory expansion, printer ports, accelerator functions, modems, and the like.

In order to facilitate connection of expansion cards to the computer circuitry, the computer has a number of expansion slots on the rear panel of the computer chassis. The expansion slots have separate removable cover plates for radiation shielding and for serving as dust covers for the expansion slots. These cover plates are removed when the expansion cards are added. The computer chassis typically includes a row of separate plug-in expansion card sockets at the base of the chassis inside the individual expansion slots. The cover plate over a selected expansion slot is removed and the expansion card is plugged into the socket inside the expansion slot. The expansion card has a long, narrow edge connector which projects from the bottom edge of the card and is plugged into the expansion card socket. The edge connector has a number of parallel metal plated contacts which make contact with corresponding spring-loaded contacts in the expansion card socket. The cover plate originally used for the expansion slot is usually thrown away when the expansion card is added. The old cover plate is replaced by a full-length mounting bracket fastened to the rear edge of the expansion card. This mounting bracket together with the card's connection to the socket at the base of the computer chassis provide a dual means of support at the bottom and rear edge of the card for stabilizing the expansion card (holding it in a fixed upright position) inside the unit.

The mounting bracket is a specially fabricated metal piece having a flat face to cover the expansion slot (to serve as the radiation shield and dust cover in place of the removed cover plate). The bracket also has a tab at its top for fastening to the top inside edge of the computer chassis by the screw that held the expansion slot's original cover plate in place. The manufacturer of the expansion card typically fastens the special mounting bracket to the expansion card during assembly of the expansion card. The bracket is rigidly fastened to the edge of the card by riveting or by fasteners such as screws. Thus, each expansion card is sold in combination with the special mounting bracket used to replace the original cover plate on the expansion slot where the card is plugged into the unit by the user.

The mounting bracket affixed to the expansion card may carry external plugs or adapters for connection to external communications such as a modem or a printer; or the bracket may have a plain, full length cover plate portion (without external plugs or adapters) if the expansion card is used solely for internal communications within the computer, such as for a hard disk drive controller, memory expansion and the like.

The present invention provides a simple and inexpensive means of fastening the expansion card in place inside the expansion slot of the computer with the result that labor and materials costs normally associated with providing expansion cards with expansion slot mounting brackets are greatly reduced.

SUMMARY OF THE INVENTION

Briefly, one embodiment of the present invention provides a simple push-on friction-hold mounting bracket releasably secured to an edge of an expansion card. The bracket includes a clip for attachment to the expansion card and a projecting tab or the like which mounts under the already-present screw or other fastener for the top of the cover plate normally available to cover the expansion slot. The clip has multiple guiding edges and stops to ensure rapid and easy assembly of the clip to the correct position on the expansion card. After the bottom edge connector of the expansion card is plugged into the socket inside the expansion slot, the tab on the pre-mounted clip is automatically aligned with and fastened to the inside of the chassis by the already-present screw for holding the original cover plate. The original cover plate remains in place to cover the expansion slot.

The small size and simplicity of the clip make it less expensive to manufacture than the special mounting bracket and cover plate currently used for mounting expansion cards. Since the already-present cover plate is used in the board mounting system of this invention, rather than cover plate being thrown away, use of the clip results in reduced materials costs. Moreover, the simple push-on friction-hold installation is fast and easy and avoids the high labor installation cost of attaching the previous bracket to each expansion card by separate fastener such as rivets or screws.

Inasmuch as much as millions of these expansion cards with attached mounting brackets are manufactured and sold annually to provide a variety of desired functions for the computer user, the cost savings provided by the mounting system of this invention are substantial.

These and other aspects of the invention will be more fully understood by referring to the following detailed description and the accompanying drawings.

BRIEF DESCRIPTION OF THE DRAWINGS

FIG. 1 is a fragmentary perspective view illustrating a prior art means of fastening a standard cover plate to an expansion slot in the rear panel of a computer chassis.

FIG. 2 is a perspective view illustrating a prior art mounting bracket commonly fastened to the rear edge of an expansion card for use in mounting the expansion card inside a computer chassis.

FIG. 3 is a perspective view showing a prior art expansion card with the mounting bracket of FIG. 2 attached to it.

FIG. 6 is a top view, partly broken away and partly in cross-section, illustrating one embodiment of the mounting clip of this invention.

FIG. 7 is a front elevation view taken on line 7—7 of FIG. 6.

FIG. 8 is an enlarged fragmentary elevation view taken within the circle 8 of FIG. 6.

FIG. 11 is a fragmentary top view, partly broken away and partly in cross-section, illustrating an alternative embodiment of a mounting clip according to principles of this invention.

FIG. 12 is a front elevation view taken on line 12—12 of FIG. 11.

DETAILED DESCRIPTION

Figure 4:
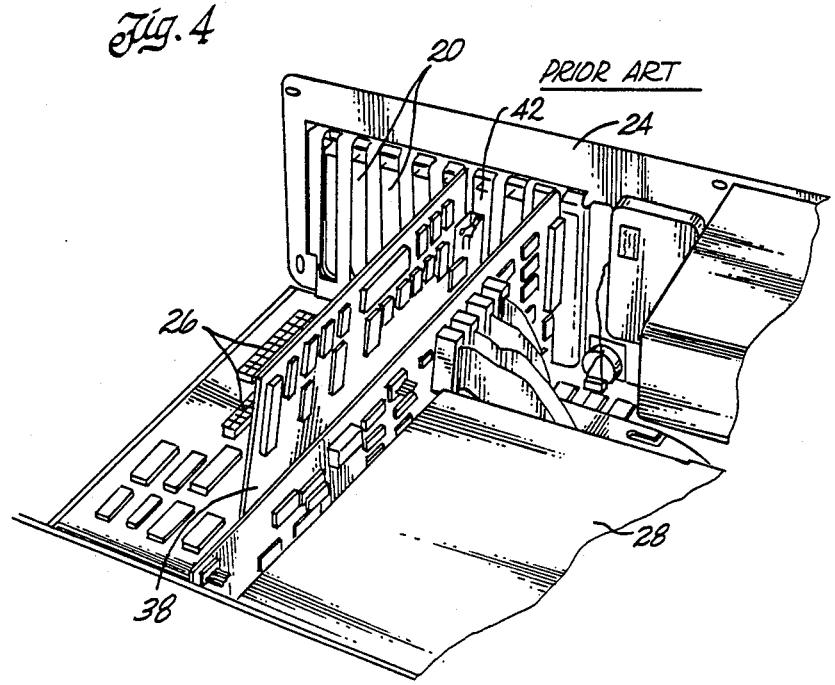
FIG. 4 is a fragmentary perspective view illustrating a prior art technique for mounting the expansion card inside the expansion slot.

FIGS. 1 through 4 illustrate prior art techniques for mounting a printed circuit board or "expansion card"0 inside one of the expansion slots of a computer chassis. FIG. 1 illustrates a series of existing cover plates 20 fastened so as to cover a series of expansion slots 22 arranged side-by-side along a rear panel 24 of a computer chassis of the personal computer variety. A series of spaced apart expansion card mounting sockets 26 are arranged parallel to one another on the base 28 of the unit inside corresponding expansion slots. The existing cover plate includes a long, narrow plate 30 for covering the full length and width of the opening created by the expansion slot. A top mounting tab 32 extends at a right angle away from the plate 30. The mounting tab 32 includes a recess 34 which fits around a screw 36 tightened against the top of the tab 32 for removably fastening the cover plate 20 over its corresponding expansion slot. The right angle bend at the top of the cover plate matches a corresponding right angle bend in a shoulder extending along the inside of the rear panel of the unit. The tab portions 32 of the cover plates are fastened to this shoulder by the screws 36 shown in FIG. 1.

FIGS. 2 and 3 illustrate a prior art technique for mounting an expansion card 38 to a corresponding one of the sockets 26 inside the expansion slots 22. The expansion card 38 can be any of a variety of printed circuit boards which are later added to the computer to provide additional functions such as a hard disk drive controller, the addition of color graphics, connection to an external printer or a modem, networking, and the like. The circuit elements 39 illustrated in FIG. 3 are simply shown schematically to represent any of various types of circuitry available in such expansion cards. The expansion card includes a bottom edge connector 40 which comprises a downwardly projecting portion of the circuit board panel. A series of spaced apart, parallel metal-plated contacts extend along opposite faces of the bottom edge connector. The expansion card 38 is mounted in a computer, as illustrated in FIG. 4, by plugging the bottom edge connector 40 into a corresponding mounting socket 26 for holding the expansion card in an upright position as shown in FIG. 4. The plug-in sockets 26 illustrated in FIG. 1 are shown schematically. These mounting sockets typically include an elongated V-shaped groove for receiving the bottom edge connector 40, together with rows of spaced apart spring loaded electrical contacts (not shown) positioned along opposite sides of the groove and spring biased into contact with corresponding metal-plated contacts on the bottom edge connector 40. The plug-in mounting of the bottom edge connector 40 in the mounting socket 26 provides a level of stability for securing the bottom portion of the expansion card in its upright position inside the computer chassis.

To further stabilize the positioning of the expansion card in the unit, a special mounting bracket 42, best illustrated in FIG. 2, is fastened to the rear edge of the expansion card. This bracket is used to mount the upright rear edge of the card to the rear panel 24 of the unit. Referring to FIG. 2, the mounting bracket 42 is made from metal and includes a long, narrow plate 44 for fitting over the entire length and width of the opening created by the expansion slot 22. The bracket 42 also includes a top mounting tab 46 which is bent at a right-angle to the plane of the plate 44 for fitting over the right angle shoulder inside the rear panel of the unit. The mounting tab 46 includes an outwardly facing recess 48. A fastener such as the already-present screw 36 used to fasten the original cover plate 20 fits into the recess 48 and is tightened against the top surface of the tab 46 for fastening the bracket 42 over the expansion slot. This step is described in more detail below. The bracket 42 also includes a narrow ear 50 at the bottom of the upright plate 44 for fitting into a slotted opening at the base of the rear panel for holding the bottom portion of the bracket in place. The bracket 42 further includes a pair of mounting ears 52 and 54 stamped from the metal used to form the bracket. These ears are bent into a complex configuration and then used for attaching the bracket 42 to the rear edge of the expansion card 38. Each of the mounting ears 52 and 54 includes a U-shaped offset 56 for fitting over the rear edge of the expansion card, and a pair of flanged portions 58 at the marginal edges of the ears for lying flush against the longitudinal face of the card to which the bracket 42 is fastened. The flanged portions 58 of the mounting ears also include internally threaded fastening holes 60 for receiving fasteners to mount the bracket to the expansion card 38.

During production of the expansion card 38, the printed circuit elements 39 are arranged and mounted on the panel portion of the board in the conventional manner; and in a separate assembly operation the mounting bracket 42 is fastened to the rear edge of the card 38 so that the cover plate portion 44 of the bracket extends at a right angle to the plane of the card, along the rear edge of the card. During installation of the expansion card, the original cover plate 20 for the mounting slot is removed from the mounting slot and is usually thrown away. The mounting bracket 42 is then used in place of the original cover plate 20 by positioning the mounting bracket so that the cover plate portion 44 fits over the expansion slot 22. The bottom edge connector 40 is plugged into the mounting socket 26 inside the expansion slot, and the already-available screw 36 previously used to fasten the original cover plate 20 is then fitted into the recessed portion 48 of the tab 46 and tightened against the tab for fastening the rear edge of the expansion card to the rear panel of the computer chassis.

Figure 5:
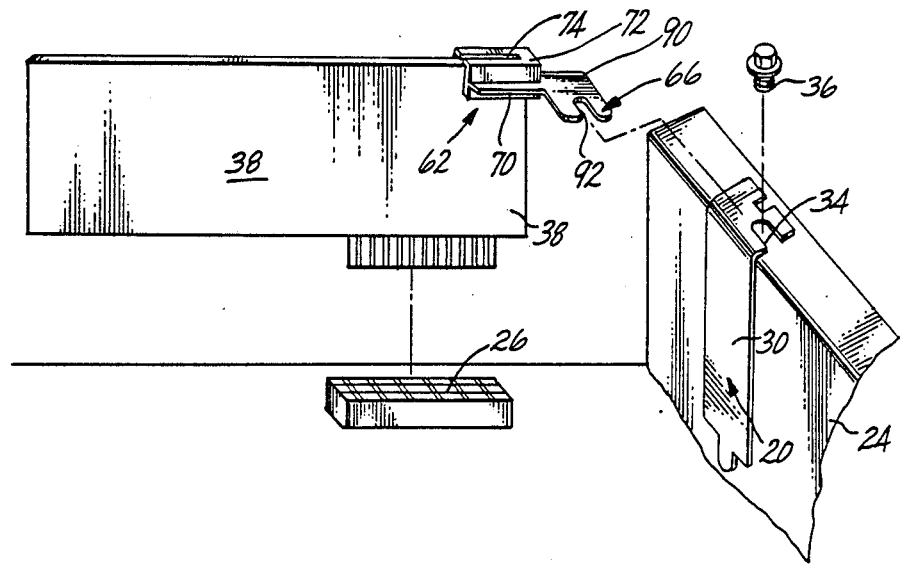
FIG. 5 is a semi-schematic perspective view illustrating an expansion card mounting system according to principles of this invention.
Figure 9:
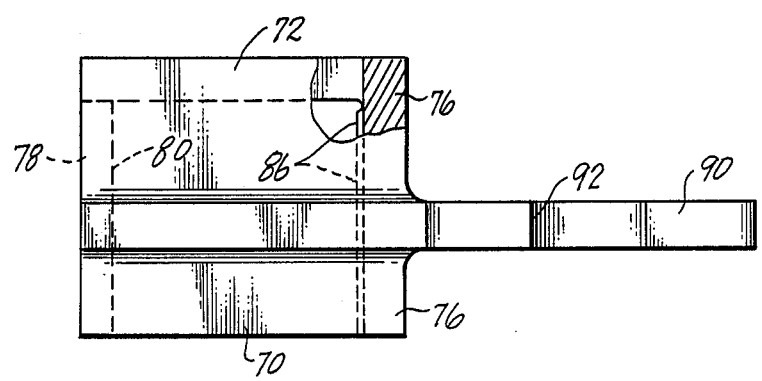
FIG. 9 is a side elevation view, partly broken and partly in cross section, taken on line 9—9 of FIG. 6.
Figure 10:
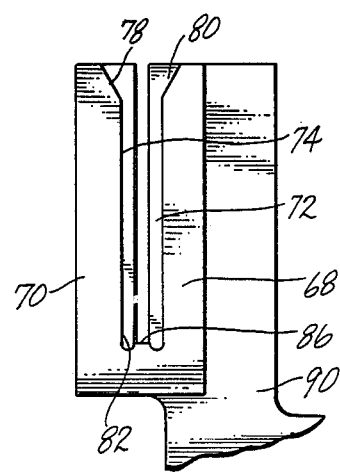
FIG. 10 is a fragmentary bottom elevation view taken on line 10—10 of FIG. 7.
Figure 13:
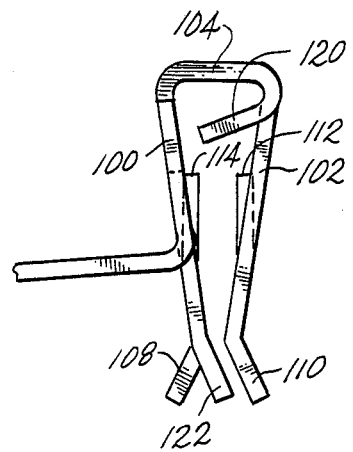
FIG. 13 is a fragmentary end elevation taken on line 13—13 of FIG. 11.
Figure 14:
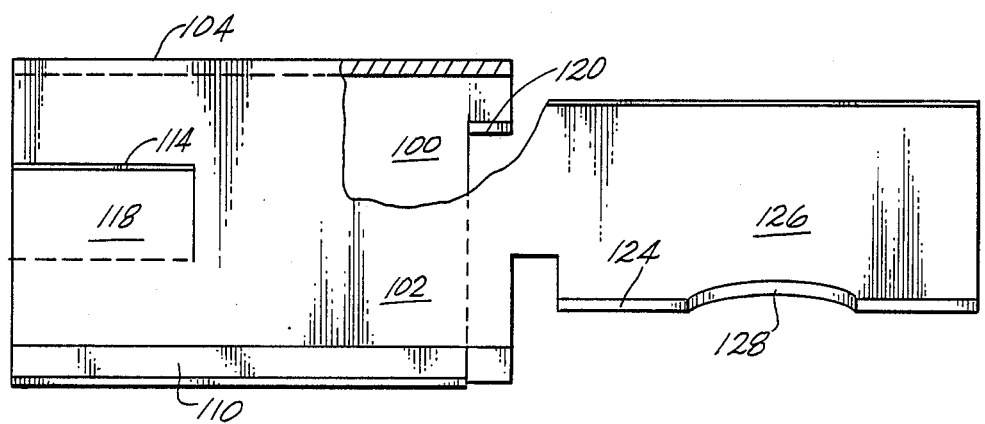
FIG. 14 is a side elevation view, partly broken away and partly end cross section, taken on line 14—14 of FIG. 11.

FIG. 5 schematically illustrates an expansion card mounting system according to principles of this invention. Generally speaking, the mounting bracket 42 is replaced by a push-on friction-hold bracket 62 which is installed on the upper corner of the expansion card 38. The bracket 62, which may also be referred to as a clip, can be made of metal or plastic. The illustration of FIG. 5 shows an embodiment of a plastic bracket by way of example. The bracket is mounted to the upper corner of the card during production by simply pushing it onto the card so that the clip is releasably held on the card by friction without the use of external fasteners for rigidly affixing the bracket to the card. The bracket is then used to mount the card to the rear panel of the computer chassis, using the already-present screw 36 for fastening the top of the bracket to the panel over the already-present cover plate 20. Thus, the cover plate 20, which is normally thrown away, is used in combination with the mounting bracket 62. The result is a substantial savings in labor and materials costs when compared with the prior art technique for mounting expansion cards as shown in FIGS. 1 through 4.

Details of the expansion card mounting system of this invention are better understood by referring to FIGS. 6 through 10 which illustrate one embodiment of the mounting bracket. In this embodiment, the mounting bracket 62 generally includes an elongated U-shaped clip 64 for extending over a top edge of an expansion card. A flat mounting tab 66 is formed integrally with a side of the clip and extends generally at a right angle to the side of the clip 64, as shown best in FIG. 7. When the mounting clip is positioned in its normal orientation for use, in which the mounting tab 66 extends in a generally horizontal direction, the clip 64 can be characterized as U-shaped or possibly C-shaped in the sense that the channel formed by the clip includes a pair of spaced apart and parallel side walls 68 and 70 on opposite sides of a rear wall 76 of the clip. The top wall 72 of the clip is split at 74 along essentially the entire length of its central axis so that the top portion of the clip forms a pair of elongated and narrow ledges 75 above the inside walls of the clip. The side walls 68 and 70 are capable of being spread apart when forcing the clip down over the expansion card. As shown best in FIGS. 6 and 10, the opposite side walls 68 and 70 of the clip are spaced apart to form a narrow, elongated slot between the inside faces of the clip side walls. The narrow slot extends upwardly for most of the length of the clip. (The length of the slot in the clip is defined herein by the vertical dimension or extent of the open space inside the clip as shown in FIG. 7, and separately by the horizontal extent of the slot as shown in FIG. 6.) During use, the expansion card fits into the slot when the clip is placed over the upper edge of the card. The inside faces of the walls 68 and 70 are tapered wider apart at the entrance end of the slot at 78. The inside faces of the walls then extend nearly parallel to one another for the remaining horizontal length of the slot; although the opposite faces of the walls actually diverge apart slightly, as best shown in FIG.6, so that the narrow-most portion of the slot is near the front of the slot at 80 and the wider part of the slot is near the rear portion of the slot at 82. In one embodiment, the narrowest portion of the slot at 80 has a width of about 0.048 inch and the wider end portion of the slot at 82 has a width of about 0.070 inch, for a card (including coatings) having a maximum thickness of about 0.069 inch. (The typical maximum thickness of an expansion card including coatings is about 0.069 inch.) At the rear of the slot, an upright face 84 on the base portion 76 of the clip faces toward the open end of the narrow slot, and an elongated narrow stop piece 86 projects forward from the rear face 84 toward the full length of the slot. This elongated stop piece provides a means for engaging the rear edge of the expansion card to prevent contact between the expansion card and the rear wall 76 of the clip.

The mounting tab portion 66 of the clip is formed integrally with the upright wall 70 of the clip and with a portion of the base 76 of the clip. As shown in best in FIG. 6, the tab portion 66 of the clip extends away from the side wall 70 and the base 76 to form a thin, flat generally rectangular tab 90 having its long axis extending perpendicularly to the horizontal axis of the slot formed in the clip. The free end of the tab has a U-shaped recess 92 facing outwardly away from the clip. The tab 66 is integrally molded with the sides of the clip to provide a substantial means of support for the outwardly projecting tab which is thereby held in a rigid position extending away from the clip.

In using the mounting clip 62, the clip may be assembled to the upper corner of the expansion card by a variety of techniques so that the walls 68 and 70 of the clip fit around opposite sides of the card and are held in tension to frictionally secure the clip to the card. In a preferred assembly technique, the side walls of the clip are placed around the side of the card and the clip is positioned lightly until the top of the card engages the ledges 75 inside the upper portion of the slot. The clip is then pushed lengthwise along the card until the upright rear edge of the card engages the stop 86 at the rear of the slot. This mounting technique can be done rapidly with a single forward motion to push the clip onto the card. Inasmuch as the rear edge of the card can have a sharpened edge, the presence of the stop 86 provides a means for contacting the edge of the card to prevent it from engaging and possibly causing stress cracks in the rear wall 76 of the clip. The card, in one embodiment, has a width of about 0.069 inch which matches the width at the widened rear portion 82 of the slot. Since the remaining portion of the slot has a narrower width, with a minimum width of preferably 0.048 inch at the narrow-most front portion 80 of the slot, the opposite walls of the clip are held in tension spread apart by the greater thickness of the card. This provides a continuous means of frictionally holding the clip in its assembled position on the upper corner of the card.

Thus, the clip can be easily assembled to the card by pushing the clip across the length of the card. Opposite sides of the clip act as a lengthwise guide until the rear wall of the clip engages the upright rear wall of the card to act as a stop for accurately positioning the clip at the corner of the card. The accurately positioned clip is restrained against downward movement and against movement along the length of the card. The tensioned opposite sides of the clip provide frictional means of attachment without the need for external fasteners such as screws or rivets. The guiding edges and stops in two axes prevent the board from lifting out of the clip. The clip also stabilizes the board against side-to-side movement.

In a preferred form of the invention, the clip 62 is preferably molded from a hard plastic material such as glass-filled nylon. The plastic material also can be filled with electrically conductive materials or fibers such as nickel plated graphite, or the like, for producing an electrically conductive bracket, if desired.

As an alternative embodiment, the opposite faces of the clip 64 also may include an internal shoulder or other projections (not shown) for fitting into corresponding detents in the card for holding the clip in place on the card as an alternative to holding the clip on the card by the tension in the side walls of the clip. This means of securing the clip to the card by cooperating shoulder and detent means is an alternate means of continuously but releasably holding the clip on the card without use of external fasteners that must be separately and independently attached to rigidly fasten a bracket to the card. As a further alternative, the inside faces of the clip can have one-way barbs for interlocking with detents on the card for rigidly and non-removably securing the clip to the board.

Since the clip 62 can be assembled to the corner of the expansion card as a step in the production of the expansion card, the labor costs in fastening the previous mounting bracket 42 to the expansion card by separate fasteners or rivets is eliminated from the production process.

In using the expansion card and the mounting clip 62, the bottom edge connector 40 of the card 38 is plugged into the mounting socket 26 at the base of the computer chassis. The already-present cover plate 30 is left in place covering the expansion slot in the rear panel 24 of the unit. Once the card 38 is mounted in the mounting socket 26, to hold the card in an upright position, the mounting tab 90 fits over the upper face of the right-angle tab 32 of the cover plate 20. The mounting clip is configured and arranged so that the slot 92 at the free end of the tab 90 automatically registers with and overlies the slotted recess 34 on the tab 32 of the cover plate. Thus, the already-present screw 36 for holding down the cover plate 20 can be removed and the slotted recess 92 of the mounting clip fits around the screw which is then tightened against the top of the tab. The combination clip and tab hold the upper corner of the upright board 38 in place adjacent the rear panel 24 of the unit. Since the already-present cover plate 20 is left in place to shield the expansion slot, the additional materials expense for fabricating the previous mounting clip 42 with its expansion slot cover plate is avoided.

FIGS. 11 through 14 show an alternative embodiment of the invention comprising a mounting bracket 94 which is preferably made of metal and used as an alternative to the plastic mounting bracket 62. The mounting bracket 94 generally includes an inverted U-shaped clip portion 96 and a flat narrow mounting tab portion 98 integrally formed with one side of the clip portion 96. The bracket is preferably made from a metal stamping with a progressive die. The metal piece is then bent into the configuration illustrated in FIGS. 11 through 14. The bracket is made from a thin metal piece, and the inverted U-shaped clip portion 96 has a pair of elongated, generally parallel and spaced apart opposite side walls 100 and 102 joined by a short, flat top wall 104. The opposite walls 100 and 102 of the clip form a long narrowed open-ended slot extending between them. The side walls 100 and 102 preferably converge inwardly toward each other in the downward direction away from the top wall 104 to a minimum spacing at 106 spaced above the bottom free ends of the walls 100 and 102. Short bottom portions 108 and 110 of the opposite side walls of the clip then diverge outwardly along the base of the clip. Elongated front portions of the clip side walls have long straight cuts 112 and 114 parallel to the bottom edges of the clip, and portions of the walls below these straight cuts in the side walls are bent inwardly to form vertical side wall portions 116 and 118 along the front inside portions of the narrow slot formed region between the opposite sides of the clip. At the rear portion of the clip near the mounting tab 98, an upper guide tab 120 is formed by an angularly downwardly and inwardly extending portion of the top base portion 104 of the clip. The upper guide tab 120 extends for a short distance into the slotted open region between the opposite side walls 100 and 102 of the clip. At the bottom rear corner of the side wall 102 closest to the tab 98, a portion of the side wall 102 is bent inwardly to form a stop 122 for extending into the slotted region between the walls of the clip. The stop 122 extends into the space within the clip by a short distance extending approximately the same length as the upper guide tab 120, and the stop 122 is located vertically below the guide tab 120 as shown best in FIG. 14.

The mounting tab portion 98 of the clip is a long, flat generally rectangular piece 124 extending perpendicularly to a vertical side wall 126 formed integrally with a rear portion of the U-shaped clip. The free end of the tab 124 opposite from the wall 126 has a U-shaped recess 128 facing away from the clip.

The metal spring clip 94 is used by first placing it lightly over the top edge of the expansion card. The lower guide tab 122 provides a means for quickly locating the clip at the upper corner of the card. The clip is then pushed downwardly with a single diagonally directed force to slip the clip onto the upper corner of the card. The opposite walls 100 and 102 of the clip are spread apart as the clip is pushed downwardly over the upper edge of an expansion card 38. The narrowmost spacing between opposite faces of the clip at 106 is substantially less than the thickness of the expansion card, so that the opposite walls of the clip 100 and 102 are held in tension on the corner of the card. The clip is pushed down over the top of the card until the top wall 104 of the clip engages the upper edge of the card. The upright rear edge of the card engages the stops provided by the upper guide tab 120 and the lower stop 122. This positions the clip accurately at the upper corner of the clip so that the recessed slot 128 in the tab can automatically overlie the slotted opening 34 of the already-present cover plate 20 for receiving the fastener 36 in a manner similar to the plastic clip 62 described above.

In addition, when the opposite walls 100 and 102 of the spring metal clip are spread apart and held in tension by the board, the upper edges 112 and 114 of the walls at the front of the clip project into the slot and can act as barbs for engaging corresponding detents or the like on opposite faces of the card. These edges 112 and 114 can also serve as means for providing electrical connections to conductive elements on the card.

Thus, the present invention provides for rapid and easy installation of the mounting clip to an accurate position on the expansion card. The small size and simplicity of the clip makes it inexpensive to manufacture and avoids the high labor installation cost of the previous bracket which requires external riveting or screws for fastening to the expansion card. The installation of the mounting clip is simple because of its push-on installation and friction hold which avoid the need for using such external fasteners. The clip also makes it possible to use the already-present cover plate on the expansion slot to provide necessary shielding, rather than replacing the cover plate with a new bracket and cover plate assembled by the expansion card manufacturer. The assembled clip provides an effective means of restraining the mounted board by preventing the board from being lifted out of the expansion socket and by preventing side-to-side movement of the board. Furthermore, the clip of this invention can be easily removed from the expansion card. As a result, cards returned to the manufacturer for repair can be easily tested with reduced labor cost owing to the ease with which the clip can be removed from the card prior to placing it on a test fixture.

What is claimed is:

1. Apparatus for mounting an expansion card inside a computer chassis having an expansion slot in a rear panel with an expansion card socket adjacent the expansion slot for receiving a connector on the card for securing the base of the card to the chassis and for making electrical connections between circuitry on the card and electrical contacts in the expansion socket, the computer chassis also having a removable cover plate separate from the expansion card for shielding the expansion slot and a fastener for releasably securing the cover plate in a fixed position in its shielding position over the expansion slot, the mounting apparatus comprising a mounting bracket having a combination board mounting clip and chassis mounting tab formed as an integral unit in which the clip fastens to a portion of the expansion card by fastening means on the clip for engaging the board in a continuous means of attachment without use of separate external fasteners that rigidly fasten the mounting bracket to the expansion card, the chassis mounting tab being arranged on the bracket with respect to the board mounting clip so that when the expansion card is plugged into the expansion socket inside the expansion slot, a portion of the chassis mounting tab extends away from the clip and automatically registers with the fastener for the cover plate so that the fastener is usable to rigidly fasten the chassis mounting tab to the computer chassis in a fixed position adjacent the cover plate, with the cover plate providing a separate means of shielding the expansion slot adjacent the mounted expansion card independently of the mounting bracket on the card.

2. Apparatus according to claim 1 in which the board mounting clip comprises an elongated channel with opposite side walls positioned to be held in tension against opposite sides of the card when the card is positioned in an open space formed between the side walls of the channel.

3. Apparatus according to claim 2 in which the chassis mounting tab is integrally formed with and projects away from an exterior side wall of the channel.

4. Apparatus according to claim 3 including a recess in the free end of the tab for automatically aligning with and receiving the fastener to be tightened against the tab.

5. Apparatus according to claim 2 in which the clip includes a rear wall integrally formed between the side walls at the end of the open space within the channel, and an interior stop projecting from the rear wall into said open space for engaging an upright edge of the expansion card to avoid contact between the card and the rear wall of the clip.

6. Apparatus according to claim 2 including a narrow, elongated slot formed along a top wall of the clip for use in spreading apart the side walls of the clip by an outward force applied from an interior region between the side walls of the clip.

7. Apparatus according to claim 6 including internal ledges adjacent opposite sides of the slot formed in the top wall of the clip, the ledges being positioned for guiding sliding movement of the clip along a top edge of the board.

8. Apparatus according to claim 7 in which the mounting bracket is made from hard plastic.

9. Apparatus according to claim 1 in which the board mounting clip comprises an elongated channel with opposite side walls positioned to engage opposite sides of the expansion card when the card is positioned in an open space formed between the side walls of the channel.

10. Apparatus according to claim 9 including stop means at the rear of the channel for engaging an edge of the expansion card to position the clip on the card so that fastener-receiving means on the chassis mounting tab automatically registers with the fastener for the cover plate.

11. Apparatus according to claim 10 in which the mounting bracket is made of spring metal.

12. Apparatus according to claim 9 in which an inside face of the channel side wall includes means for interlocking with the expansion card.

13. Apparatus according to claim 10 in which the side walls of the channel are arranged to be functionally held in contact with the sides of the expansion card.

14. A system for mounting an expansion card inside a computer chassis, comprising the combination of:
   an expansion slot in a rear panel of the computer chassis;
   an expansion card adjacent the expansion slot for receiving a connector on the expansion card for securing the card to the base of the chassis and for making electrical connections between circuitry on the card and electrical contacts in the expansion socket;
   a removable cover plate on a panel of the chassis for shielding the exposed slot from the exterior of the computer unit;
   a fastener for releasably securing the cover plate in its shielding position over the expansion slot;
   a mounting bracket having a combination board mounting clip and chassis mounting tab formed as an integral unit in which the clip is fastened to a portion of the expansion card by fastening means on the clip for engaging the card in a continuous means of attachment without use of separate external fastener means rigidly fastening the mounting bracket to the expansion card;
   the chassis mounting tab being arranged on the bracket with respect to the board mounting clip so that when the expansion card is plugged into the expansion socket, a portion of the chassis mounting tab automatically registers with the fastener for the cover plate so that the fastener rigidly fastens the chassis mounting tab to the computer chassis adjacent the cover plate, with the cover plate providing a separate means of shielding the expansion slot adjacent the mounted expansion board.

15. Apparatus according to claim 14 in which the board mounting clip comprises an elongated channel with opposite side walls positioned to be held in continuous tension against opposite sides of the expansion card when the card is positioned in an open space formed between the side walls of the channel.

16. Apparatus according to claim 14 in which the clip includes a rear wall integrally formed between the side walls at the end of the open space within the channel, and an interior stop projecting from the rear wall into said open space for engaging an upright edge of the expansion card.

17. Apparatus according to claim 14 including a narrow, elongated slot formed along a top wall of the clip for use in spreading apart the side walls of the clip by an outward force applied from an interior region between the side walls of the clip.

18. Apparatus according to claim 14 in which the board mounting clip comprises an elongated channel with opposite walls positioned to engage the opposite sides of the expansion card when the expansion card is positioned in an open space formed between the side walls of the channel.

19. Apparatus according to claim 18 including stop means at the rear of the channel for engaging an edge of the expansion card to position the clip on the card so that fastener-receiving means on the chassis mounting tab automatically registers with the fastener for the cover plate.

20. Apparatus for mounting an expansion card inside a computer chassis having an expansion slot in a rear panel with an expansion card socket adjacent the expansion slot for receiving a connector on the card for securing the base of the card to the chassis and for making electrical connections between circuitry on the card and electrical contacts in the expansion socket, the computer chassis also having a removable cover plate on a panel of the chassis for shielding the expansion slot from the exterior of the computer unit, and a fastener for releasably securing the cover plate in its shielding position over the expansion slot, the mounting system comprising a mounting bracket having a combination board mounting clip and chassis mounting tab formed as an integral unit, in which the board mounting clip comprises an elongated channel with opposite side walls positioned to be held in tension against opposite faces of the expansion card when the card is positioned in an open space formed between the side walls of the channel, and in which the chassis mounting tab is integrally formed with and extends away from a side wall portion of the clip, the side walls of the clip being spaced apart sufficiently for releasably engaging the board in a continuous frictional means of attachment without use of separate external fastening means rigidly fastening the mounting bracket to the expansion card, the chassis mounting tab being positioned on the bracket with respect to the clip so that when the expansion card is plugged into the expansion socket and the clip is held in said fixed position, a fastener-receiving portion of the chassis mounting tab automatically registers with the fastener for the cover plate so that the fastener is usable to rigidly fasten the tab to the computer chassis in a stationary position adjacent the cover plate, with the mounted bracket providing resistance to upward movement and side-to-side movement of an upper portion of the mounted expansion cards, and with the cover plate providing a separate and independent means of shielding the expansion slot adjacent the mounted expansion card.

* * * * *